(12) United States Patent
Fricker

(10) Patent No.: US 9,148,975 B2
(45) Date of Patent: Sep. 29, 2015

(54) ELECTRONIC INTERCONNECT METHOD AND APPARATUS

(75) Inventor: Jean-Philippe Fricker, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 646 days.

(21) Appl. No.: 13/530,958

(22) Filed: Jun. 22, 2012

(65) Prior Publication Data

US 2013/0342996 A1   Dec. 26, 2013

(51) Int. Cl.
*H05K 7/20* (2006.01)
*H05K 7/14* (2006.01)

(52) U.S. Cl.
CPC ............ *H05K 7/1441* (2013.01); *H05K 7/1444* (2013.01); *H05K 7/20554* (2013.01); *H05K 7/20581* (2013.01); *H05K 7/20718* (2013.01)

(58) Field of Classification Search
CPC ............ H05K 1/0203; H05K 7/20709; H05K 7/1488; G06F 11/1423; G06F 1/20
See application file for complete search history.

(56) References Cited

U.S. PATENT DOCUMENTS

| | | |
|---|---|---|
| 4,376,921 A | 3/1983 | Dickens et al. |
| 4,503,484 A | 3/1985 | Moxon |
| 4,509,810 A | 4/1985 | Erlam et al. |
| 4,763,340 A | 8/1988 | Yoneda et al. |
| 5,012,321 A | 4/1991 | Magarshack |
| 5,073,761 A | 12/1991 | Waterman et al. |
| 5,168,242 A | 12/1992 | Willems et al. |
| 5,329,418 A | 7/1994 | Tanabe |
| 5,571,256 A | 11/1996 | Good et al. |
| 5,701,037 A | 12/1997 | Weber et al. |
| 5,786,979 A | 7/1998 | Douglass |
| 5,847,447 A | 12/1998 | Rozin et al. |
| 5,977,631 A | 11/1999 | Notani |
| 6,049,463 A | 4/2000 | O'Malley et al. |
| 6,052,281 A | 4/2000 | Hardt et al. |
| 6,612,852 B1 | 9/2003 | Panella |
| 6,704,199 B2 | 3/2004 | Wiley |
| 6,741,466 B1 | 5/2004 | Lebo |
| 6,760,220 B2 | 7/2004 | Canter et al. |
| 7,224,588 B2 | 5/2007 | Nieman et al. |
| 7,688,593 B2 | 3/2010 | Byers et al. |

(Continued)

OTHER PUBLICATIONS

Heilind Inc., Zipline-to-Coplanar Boards, Photo at http://www.heilind.com/products/fci/news/ZipLine_to_Coplanar.jpg, Feb. 2012.

(Continued)

*Primary Examiner* — Gregory Thompson

(57) ABSTRACT

An electronics chassis has many removable boards on sleds that are interconnected by a honeycomb interconnect structure. Interconnect boards in Y-planes and Z-planes are orthogonal to each other and form cells. Cooling air flows through the cells in an X direction, parallel to surfaces of the interconnect boards. The removable boards have connectors that mate with an edge of Z-divider interconnect boards. Fans blow air through the cells in the honeycomb structure unimpeded since no boards are perpendicular to the airflow. Notches in the rear of the Z-divider boards provide airflow equalization allowing closer spacing of fans to the honeycomb structure. A sled carrier honeycomb structure is placed in front of the honeycomb interconnect structure to guide sleds into position. Sled carrier dividers are offset from the Z-divider boards to allow removable boards to align with Z-divider boards in the Z-planes, parallel to airflow.

18 Claims, 15 Drawing Sheets

(56) References Cited

U.S. PATENT DOCUMENTS

| | | | |
|---|---|---|---|
| 7,804,684 B1* | 9/2010 | Aybay et al. | 361/679.5 |
| 7,808,792 B2* | 10/2010 | Nguyen | 361/721 |
| 2002/0018339 A1* | 2/2002 | Uzuka et al. | 361/796 |
| 2002/0182899 A1 | 12/2002 | Debord et al. | |
| 2004/0001311 A1 | 1/2004 | Doblar et al. | |
| 2005/0047098 A1 | 3/2005 | Garnett et al. | |
| 2007/0086175 A1 | 4/2007 | Davis et al. | |
| 2008/0048796 A1 | 2/2008 | Shaul et al. | |
| 2008/0122489 A1 | 5/2008 | Hailey | |
| 2008/0310097 A1 | 12/2008 | Sherrod et al. | |
| 2008/0315978 A1 | 12/2008 | Knight et al. | |
| 2009/0059522 A1* | 3/2009 | Katakura et al. | 361/695 |
| 2009/0227153 A1 | 9/2009 | Zaderej et al. | |
| 2010/0002382 A1* | 1/2010 | Aybay et al. | 361/695 |
| 2010/0014248 A1* | 1/2010 | Boyden et al. | 361/695 |
| 2010/0081298 A1 | 4/2010 | Hamner et al. | |

OTHER PUBLICATIONS

Molex Inc., Impact Connector System, Photo at http://www.molex.com/mx_upload/family/impact153_100_ohm_orthogonal_backplane_connector_system/Impact_100_Ohm_Orthogonal_Direct_Configuration.jpg, Feb. 2012.

International Search Report and Written Opinion correlating to PCT/US13/46942 dated Dec. 3, 2013, 14 pages.

* cited by examiner

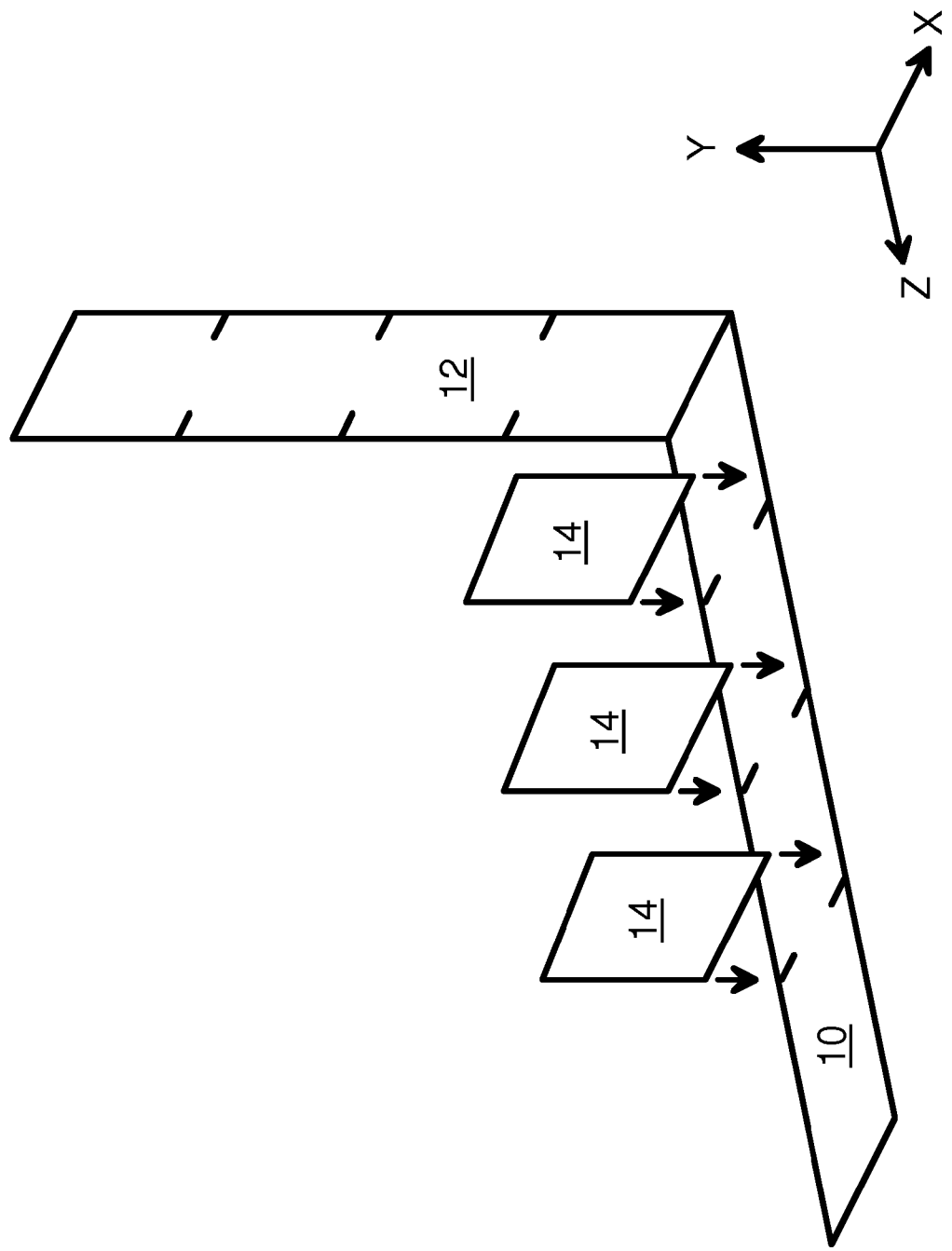

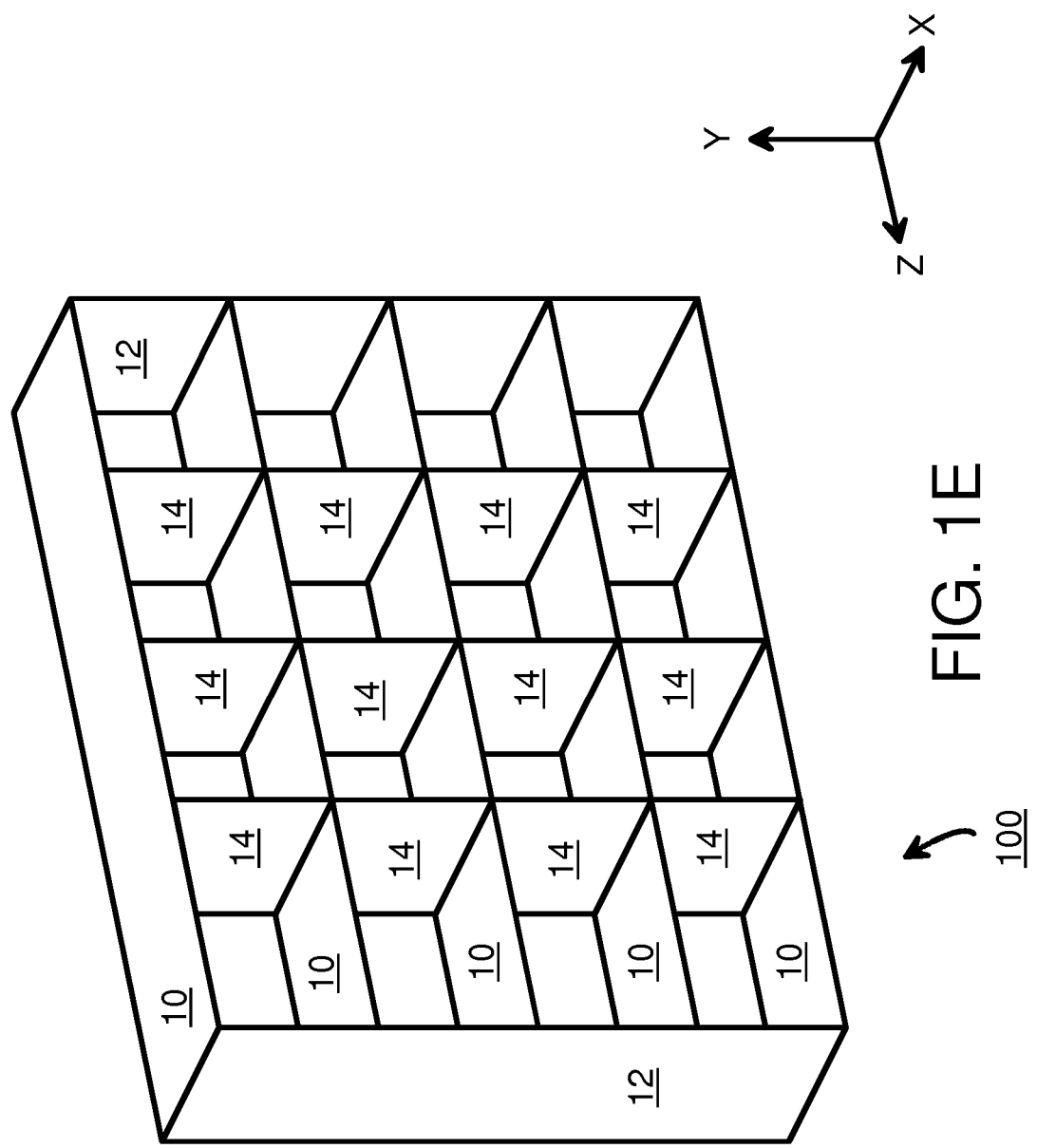

FIG. 9  SIDE VIEW

SIDE VIEW

SIDE VIEW

ELECTRONIC INTERCONNECT METHOD AND APPARATUS

FIELD OF THE INVENTION

This invention relates to methods and apparatus for electronic interconnect, and more particularly to electronic chassis with interconnect boards.

BACKGROUND OF THE INVENTION

Many larger electronic systems are contained in one or more cabinets or chassis that allow removal of racks, drawers, or boards. Boards may need to be added or removed while the system is still operating for repair or expansion purposes. In older systems, boards were interconnected by many cables, often creating a confusing nest of cabling.

More recently, a larger board known as a backplane is provided with connector sockets that receive the edges of boards. A midplane is a variation of a backplane that is not located in the back of the chassis, but is located in the middle of the chassis. Connector sockets may be mounted to both sides of a midplane board, allowing boards to be inserted on both surfaces of the midplane.

Boards are inserted perpendicularly to the main surfaces of backplanes and midplanes. Cooling airflow is often directed between the removable boards. Since the backplane or midplane is orthogonal to the removable boards, backplanes and midplanes often act as a wall to block the airflow and to restrict the airflow to a single vertical direction. Holes or notches may be added to the backplane or midplane to allow for some air to flow through, but this may waste valuable component space. Cascading several boards together may require a higher or cooler airflow.

A variety of other configurations have been attempted, such as co-planar backplanes that are mated through a connector, and orthogonal backplanes that mate through specialized connectors. Although co-planner backplanes are parallel to each other, they only span one dimension each and are rarely used. Orthogonal backplanes often require staggering boards and other specialized connectors. The density of the removable boards is often less than desired.

What is desired is an improved high-density interconnect.

BRIEF DESCRIPTION OF THE DRAWINGS

FIGS. 1A-E show construction of a honeycomb structure that replaces a backplane for interconnect.

DETAILED DESCRIPTION

The present invention relates to an improvement in electronic system interconnect. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that a backplane may act as a wall to block airflow between removable boards inserted into the backplane. The inventor realizes that a flat planar backplane may be replaced by a honeycomb-like (or grid-like) structure. In some exemplary embodiments each cell of the honeycomb structure can receive one removable board. The walls of the honeycomb structure are interconnect boards. The removable board is inserted parallel to two of the walls of a honeycomb cell. Air may flow parallel to both the removable board and to the cell walls of the honeycomb structure. Thus the airflow-blocking backplane has been opened up by the cells of the honeycomb structure, allowing air to pass through and cool both the removable boards and the interconnect boards.

Figure 1B:
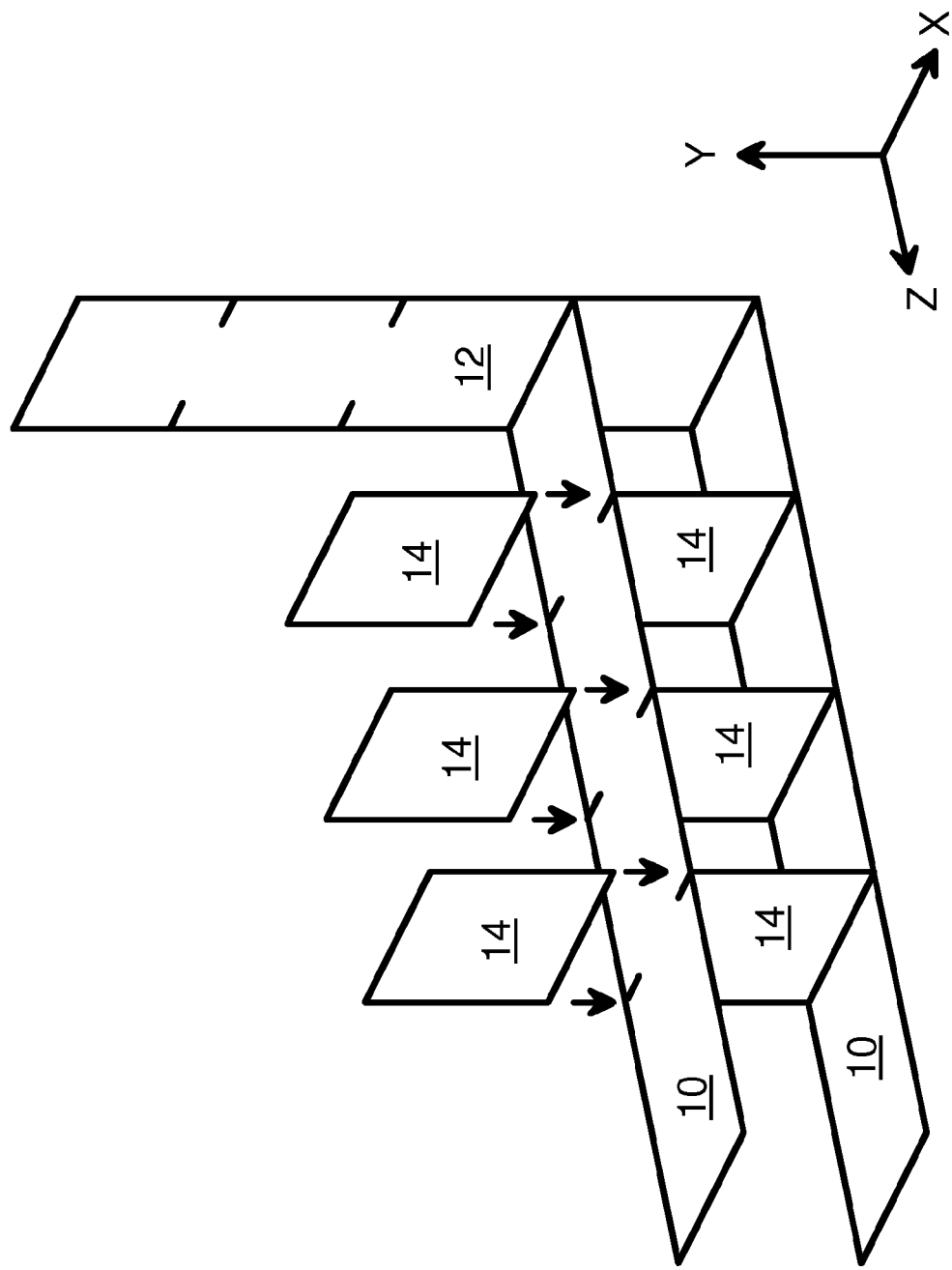

FIGS. 1A-E show construction of a honeycomb structure that replaces a backplane for interconnect. In FIG. 1A, y-plane board 10 forms the floor of the structure and is in the y-plane (that is, a y-plane board 10 has a normal that is parallel to the y-axis). Z-plane board 12 forms the right edge of the structure and is in the z-plane (that is, a Z-plane board 12 has a normal that is parallel to the z-axis). Z-divider boards 14 are in other z-planes that are parallel to z-plane board 12 (and, consistent with the naming convention used herein, Z-divider boards 14 have a normal that is parallel to the z-axis). Z-planes have normal vectors that are parallel to the z-axis. Z-divider boards 14 are inserted into connector sockets on y-plane board 10 or are otherwise mounted to y-plane board 10.

In FIG. 1B, a second y-plane board 10 has been attached to the tops of the first row of z-divider boards 14 and to z-plane board 12. Edge connectors, sockets, or other standard connectors may be used. A second row of z-divider boards 14 is then inserted into sockets on the top of second y-plane board 10.

Figure 1C:
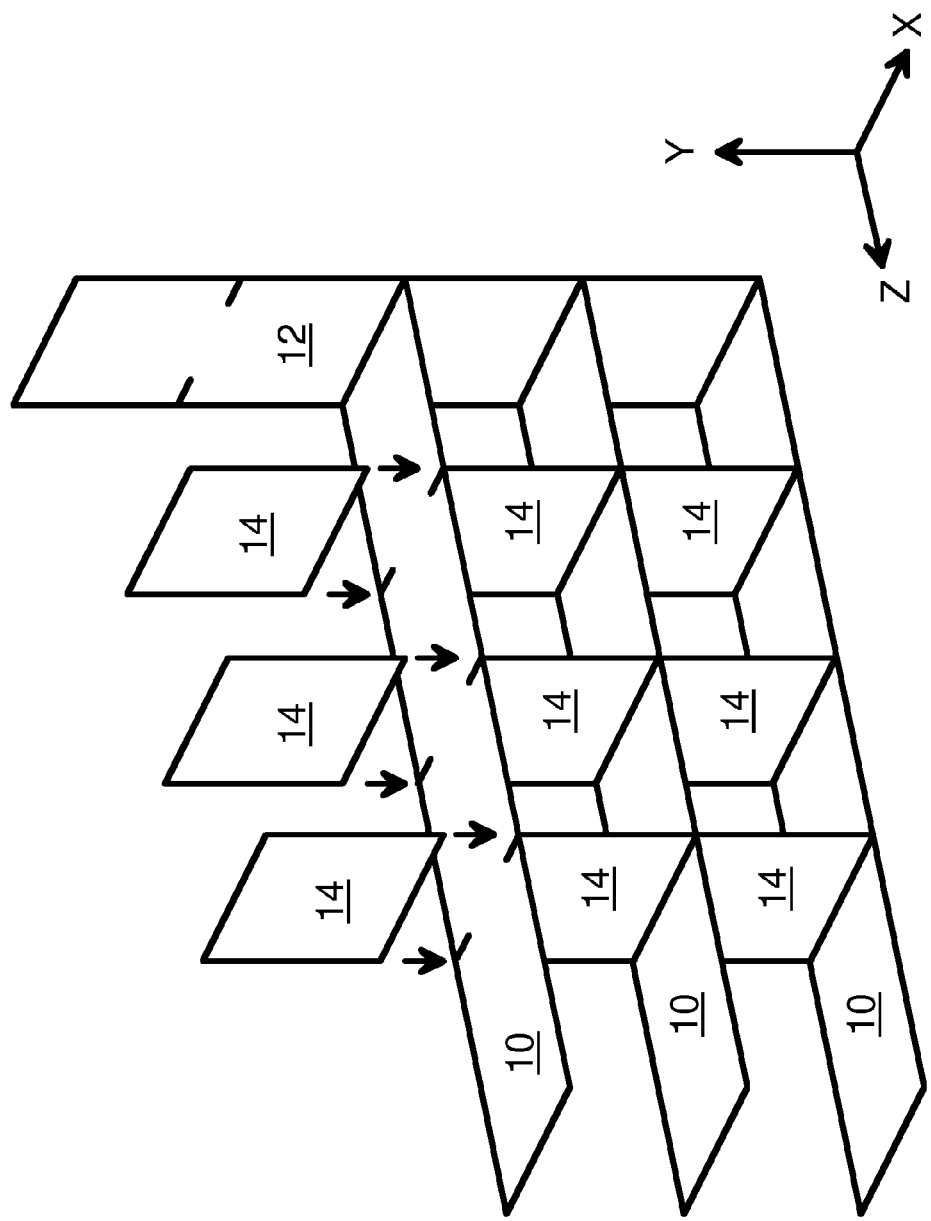

In FIG. 1C, a third y-plane board 10 has been attached to the tops of the second row of z-divider boards 14 and to z-plane board 12. A third row of z-divider boards 14 is then inserted into sockets on the top of third y-plane board 10.

Figure 1D:
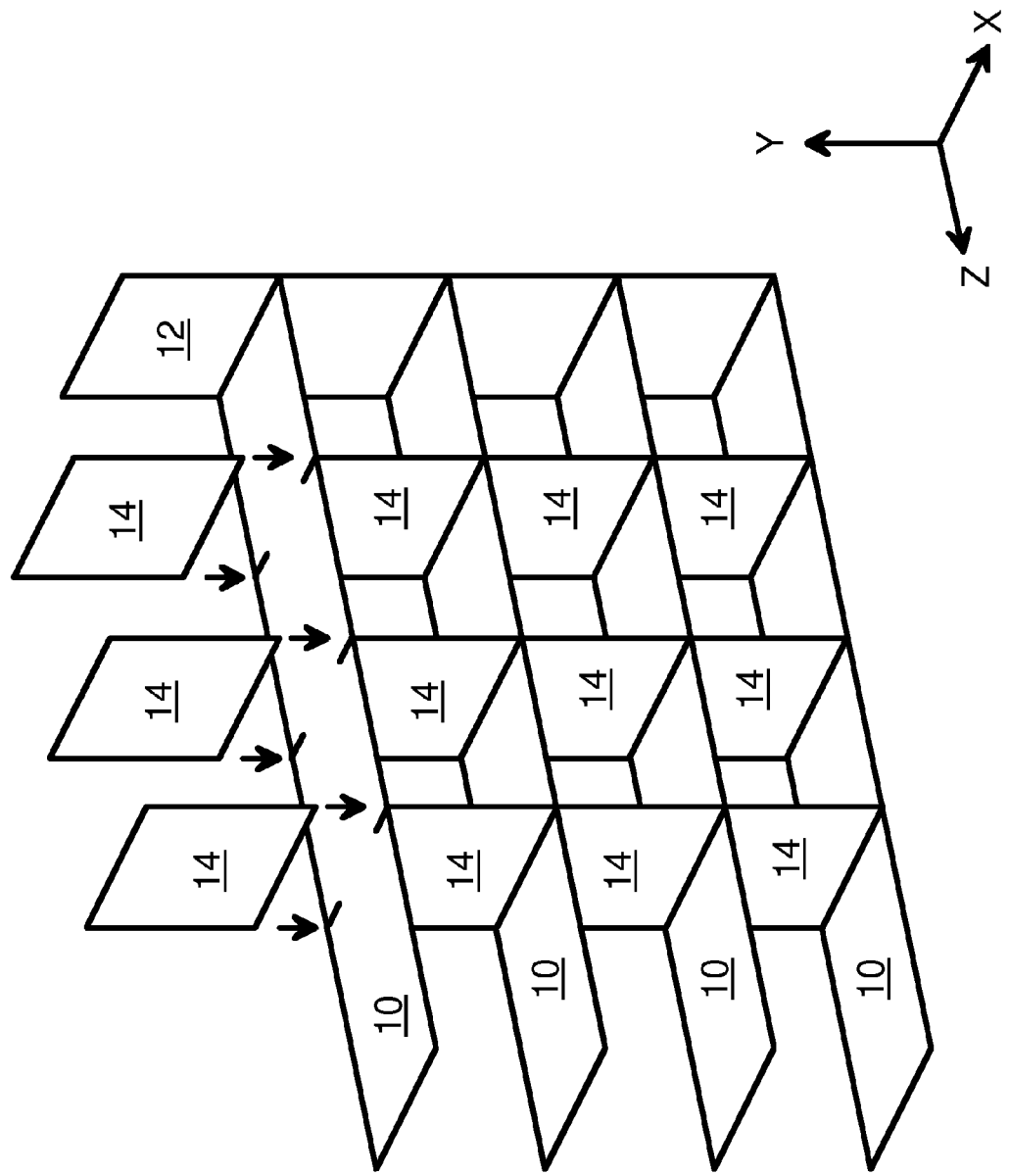

In FIG. 1D, a fourth y-plane board 10 has been attached to the tops of the third row of z-divider boards 14 and to z-plane board 12. A fourth row of z-divider boards 14 is then inserted into sockets or other connectors on the top of fourth y-plane board 10.

In FIG. 1E, a fifth y-plane board 10 has been attached to the tops of the fourth row of z-divider boards 14 and to z-plane board 12. A second z-plane board 12 is attached to the left edges of all five y-plane boards 10.

A total of 16 honeycomb cells are formed by the structure in FIG. 1E. Each cell has two edges, a top and a bottom, formed from parts of two y-plane board 10. Each cell has two sides, formed by two z-divider boards 14, or by one z-divider boards 14 and one z-plane board 12.

Y-plane boards 10, z-plane boards 12, and z-divider boards 14 are adapted to be interconnected to other boards and may include one or more interconnect devices formed on them, such as by metal wiring traces on a printed-circuit board (PCB), sockets, adapters, plugs, and the like. Edge connectors or sockets allow interconnect between boards where y-plane boards 10, z-plane boards 12, and z-divider boards 14 intersect.

As is shown later in FIGS. 5-6, one removable board (removable board 30) may be mated with various parts of the 16 cells of FIG. 1E. The removable board 30 is in the z-plane and parallel to z-divider boards 14 and z-plane board 12.

Figure 2:
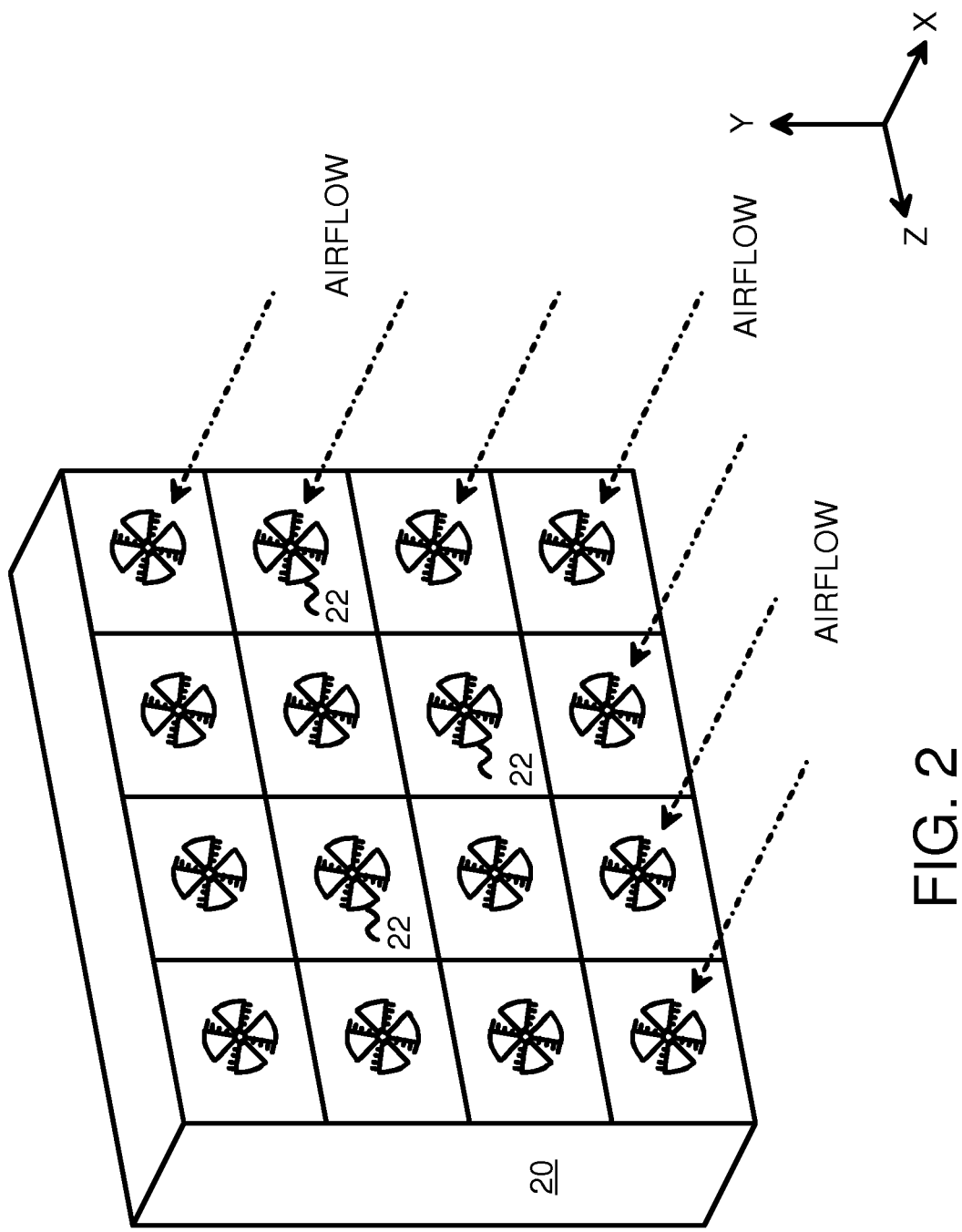
FIG. 2 shows a bank of fans that pulls air through the honeycomb interconnect structure.

FIG. 2 shows a bank of fans that pulls air through the honeycomb interconnect structure. Fan bank 20 has several fans 22 that pull air from their fronts and expels the air behind fan bank 20. The air flow is in the x direction, according to the x, y, z reference used in the drawings. Fans 22 may be mounted to fan trays or racks that are removable, such as for servicing, upgrading or replacement of faulty fans 22, or other boards 10, 12, 14 or 30.

Figure 3:
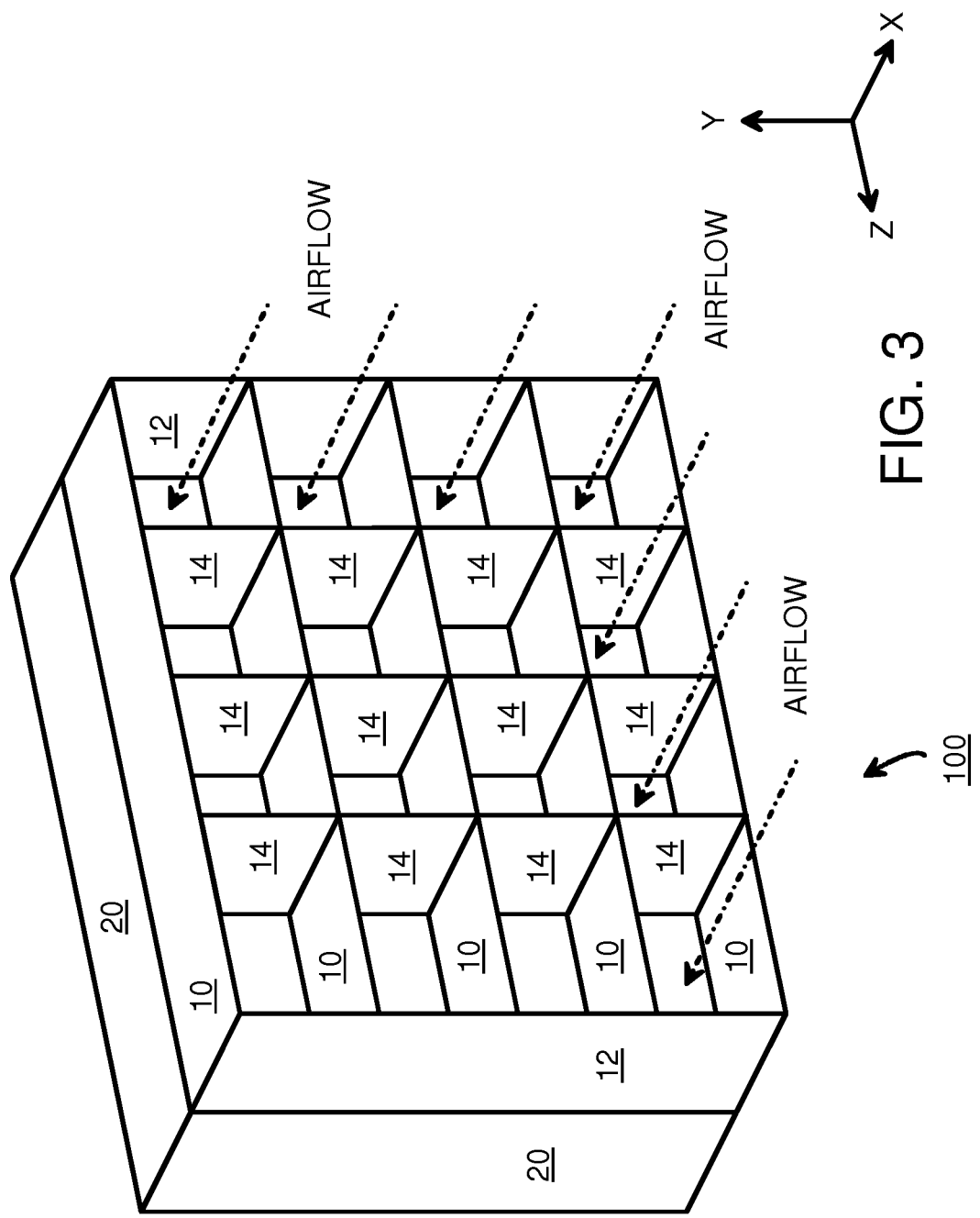
FIG. 3 shows the honeycomb interconnect structure with a fan bank creating an airflow through the cells of the honeycomb structure.

FIG. 3 shows the honeycomb interconnect structure with a fan bank creating an airflow through the cells of the honeycomb structure. Fan bank 20 is attached to one x-plane (e.g., the rear) of honeycomb interconnect structure 100 also shown in FIG. 1E. Fan bank 20 moves air through the cells of the honeycomb interconnect structure.

Air flows in the negative x direction in the exemplary embodiment, parallel to the surfaces of the removable boards (not shown), z-divider boards 14, and z-plane board 12. This minus x-direction airflow is also parallel to the surfaces of y-plane boards 10.

Y-plane boards 10 are in the exemplary embodiments orthogonal to z-plane boards 12 and z-divider boards 14 but substantially parallel to the airflow and the direction of removal of the removable boards. Z-plane boards 12 and z-divider boards 14 are orthogonal to y-plane board 10 but parallel to the airflow and the direction of removal of the removable boards. Since none of y-plane boards 10, z-plane boards 12, or z-divider boards 14 are perpendicular to the airflow direction (none are orthogonal), the airflow from fan bank 20 is not substantially impeded. There is no wall, such as a flat backplane board, to block the airflow.

Figure 4:
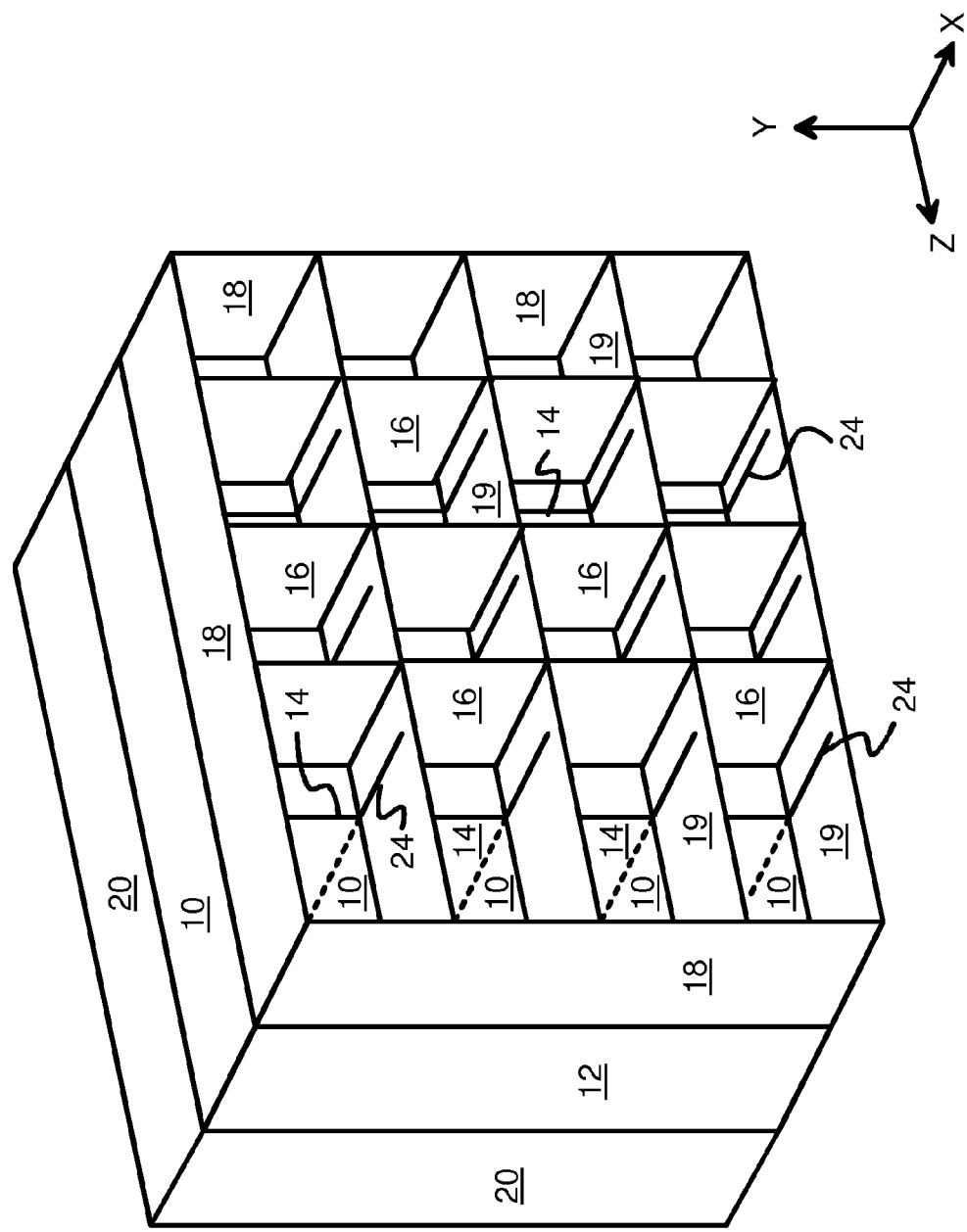
FIG. 4 shows the honeycomb interconnect structure with sled carriers to guide removable boards.

FIG. 4 shows the honeycomb interconnect structure with sled carriers to guide removable boards. While the removable boards could be inserted into each cell of the honeycomb, an extension of the honeycomb interconnect is used to guide and receive the removable boards.

An extension of the honeycomb interconnect structure of y-plane boards 10, z-plane boards 12, and z-divider boards 14 is provided by sled carrier walls 18, sled carrier dividers 16, and sled carrier floors 19. Sled carrier walls 18, sled carrier dividers 16, and sled carrier floors 19 may be formed in the same basic manner as described for y-plane boards 10, z-plane boards 12, and z-divider boards 14 as shown in FIGS. 1A-E and is placed in front of the honeycomb interconnect structure of y-plane boards 10, z-plane boards 12, and z-divider boards 14. Alternative arrangements and embodiments of sleds 16, 18 and 19 may also be provided. Sleds 16, 18 and 19 may provide mere structural support or may be electrically connected to portions of boards, 10 or 12.

However, sled carrier dividers 16 are offset from the positions of z-divider boards 14. This offset allows the front edges of z-divider boards 14 to be exposed between or next to sled carrier dividers 16. A removable board (not shown) is connected to this exposed edge of z-divider board 14.

Sled guides 24 are formed on the top surfaces of sled carrier floors 19. Each sled guide 24 can be a groove or other positioning aid that accepts an edge of a removable board, or a sled that holds the removable board, and guides the removable board into position with the exposed edge of z-divider board 14 to allow for the connectors to mate during insertion. Other sled guides 24 may be formed on the bottoms of sled carrier floors 19 and on the bottom of the top sled carrier wall 18, but these are not visible in the perspective view of FIG. 4.

Figure 5:
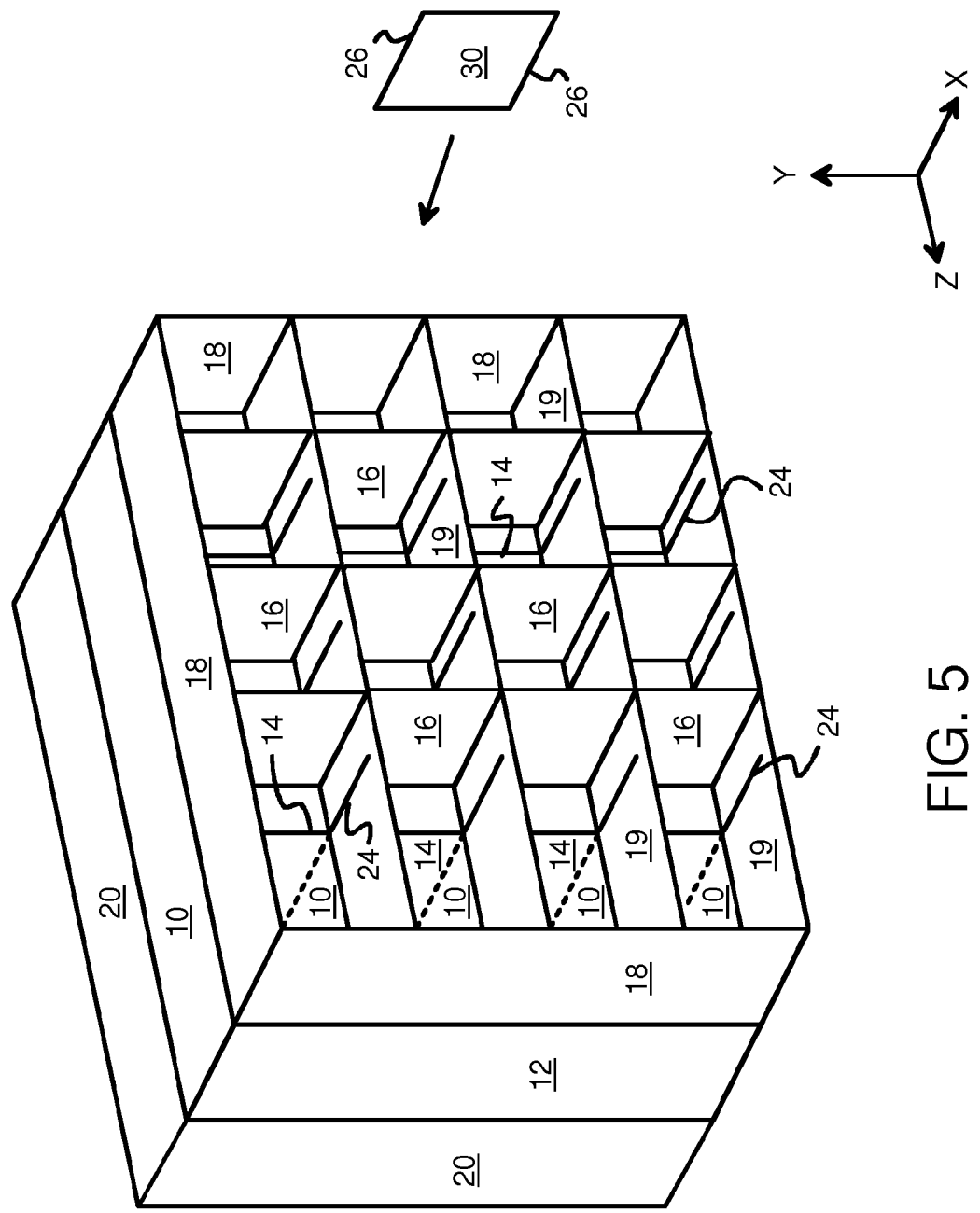
FIG. 5 shows a removable board being inserted into the sled guides to mate with an exposed edge of the z-divider boards.

FIG. 5 shows a removable board being inserted into the sled guides to mate with an exposed edge of the z-divider boards. Sled 30 holds a removable board, such as a circuit board with integrated circuits (IC's) and other electronic components. Each removable board may be a computer processor board, a communication board, a storage card, a network card, etc. in a larger system.

Sled 30 has edges 26 that fit into sled guides 24 on sled carrier floors 19. The direction of insertion of sled 30 is in the negative x direction. This is the same direction as the airflow direction.

Figure 6:
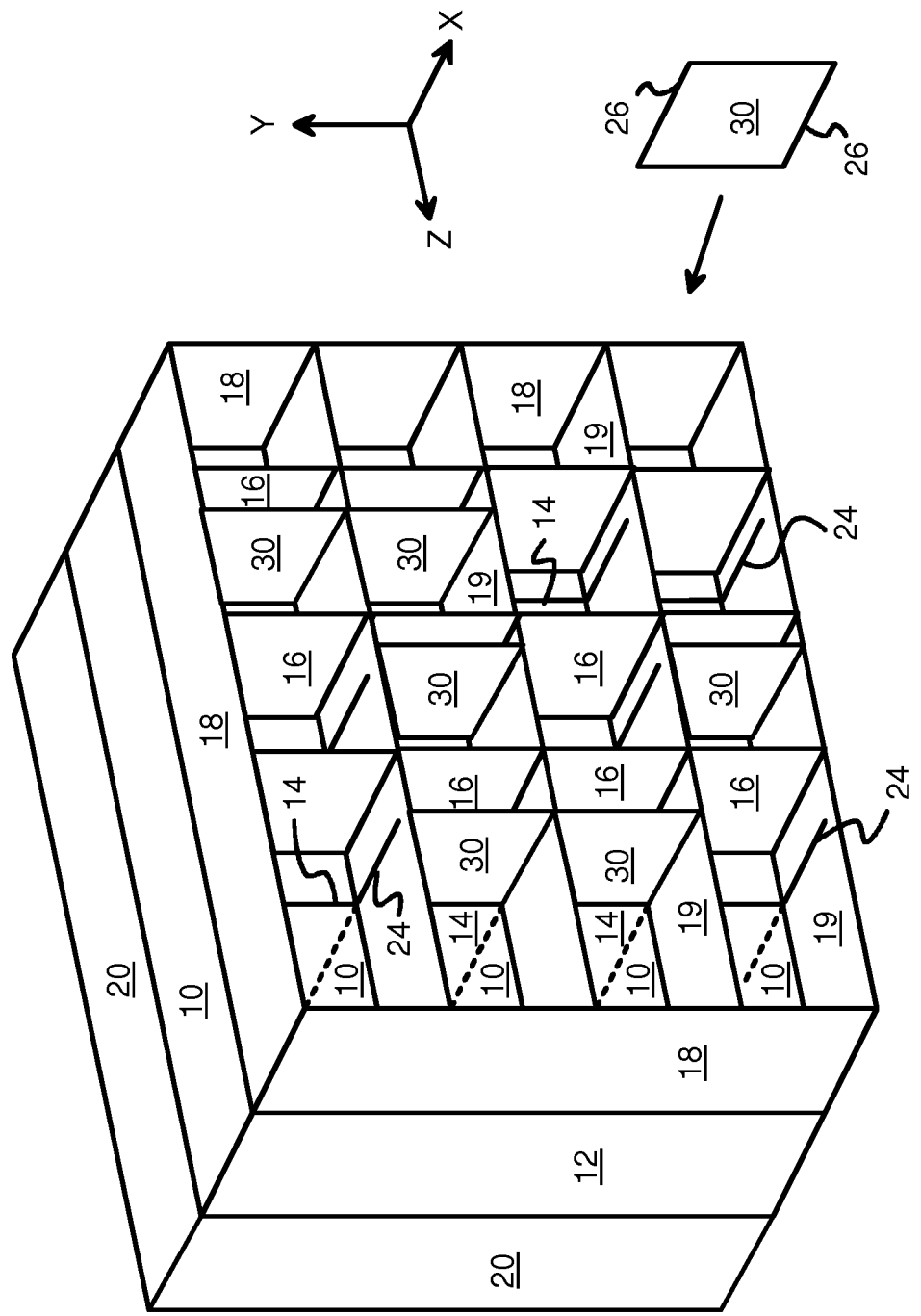
FIG. 6 shows several sleds of removable boards that have been inserted into the honeycomb interconnect structure.

In FIG. 6, several sleds of removable boards have been inserted into the honeycomb interconnect structure. Edges 26 of sleds 30 are guided by sled guides 24 as they are pushed in the -x direction. Sled guides 24 align a connector at the far edge of the removable board mounted on sled 30 with a mating connector on the exposed edge of z-divider board 14. A final firm pressure is applied to lock the connectors together, bringing the removable board on sled 30 in electrical contact with z-divider board 14, which is interconnected to other removable boards by the honeycomb of interconnected y-plane boards 10, z-plane boards 12, and z-divider boards 14.

When inserted, the removable boards on sleds 30 are parallel to sled carrier dividers 16 and approximately co-planar with some z-divider boards 14. Airflow from fan bank 20 moves across the surfaces of the removable boards on sleds 30, and also across the surfaces of z-divider boards 14, y-plane boards 10, and z-plane boards 12. None of the boards or dividers are perpendicular to the direction of airflow. Thus cooling is enhanced by the geometry of the honeycomb interconnect structure.

Figure 7:
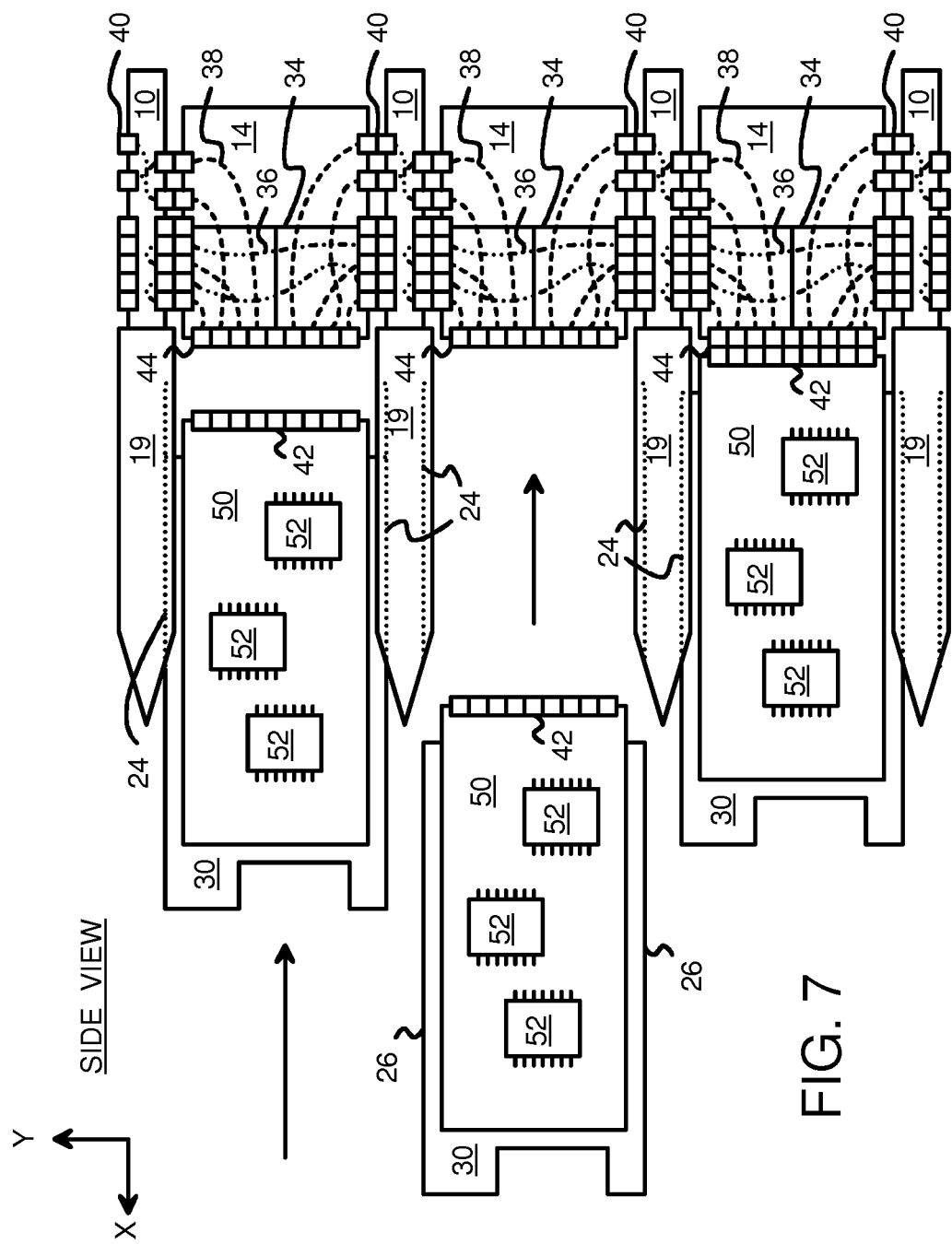
FIG. 7 is a side view highlighting insertion of removable boards on sleds into the z-divider boards.

FIG. 7 is a side view highlighting insertion of removable boards on sleds into the z-divider boards. Removable boards 50 are printed-circuit boards (PCB's) with integrated circuit chips 52 mounted thereon and connected by metal wiring traces. Connectors 42 mate with connectors 44 on z-divider boards 14 when fully inserted.

Sleds 30 are attached to removable boards 50 and have edges 26 that fit into sled guides 24 on sled carrier floors 19. Sleds 30 may be plastic or have hand grips that facilitate handling and insertion and removal. Insertion is in the -x direction and removal is in the +x direction. Clips or other mechanisms to secure sled 30 or removable board 50 in place may be added.

Z-divider boards 14 have connectors 44, 40 along three edges. Connectors 44 make connection to removable boards 50, while connectors 40 make connection to y-plane board 10, which are shown edge-on in FIG. 7. Metal traces on z-divider boards 14 provide portions of the interconnection among the connected boards. The center connector pads or pins in each set of connectors are connected to power traces 34, which can include power and ground traces. Z fabric traces 36 connect between connectors 40 to connect between y-plane board 10, while Y fabric traces 38 connect between connector 44 and connector 40, forming interconnect from removable boards 50 to y-plane board 10. A folded toroidial interconnect of sleds 30 may be achieved through the y-plane as well, and even through a combination with Z-divider boards 14.

Figure 8:
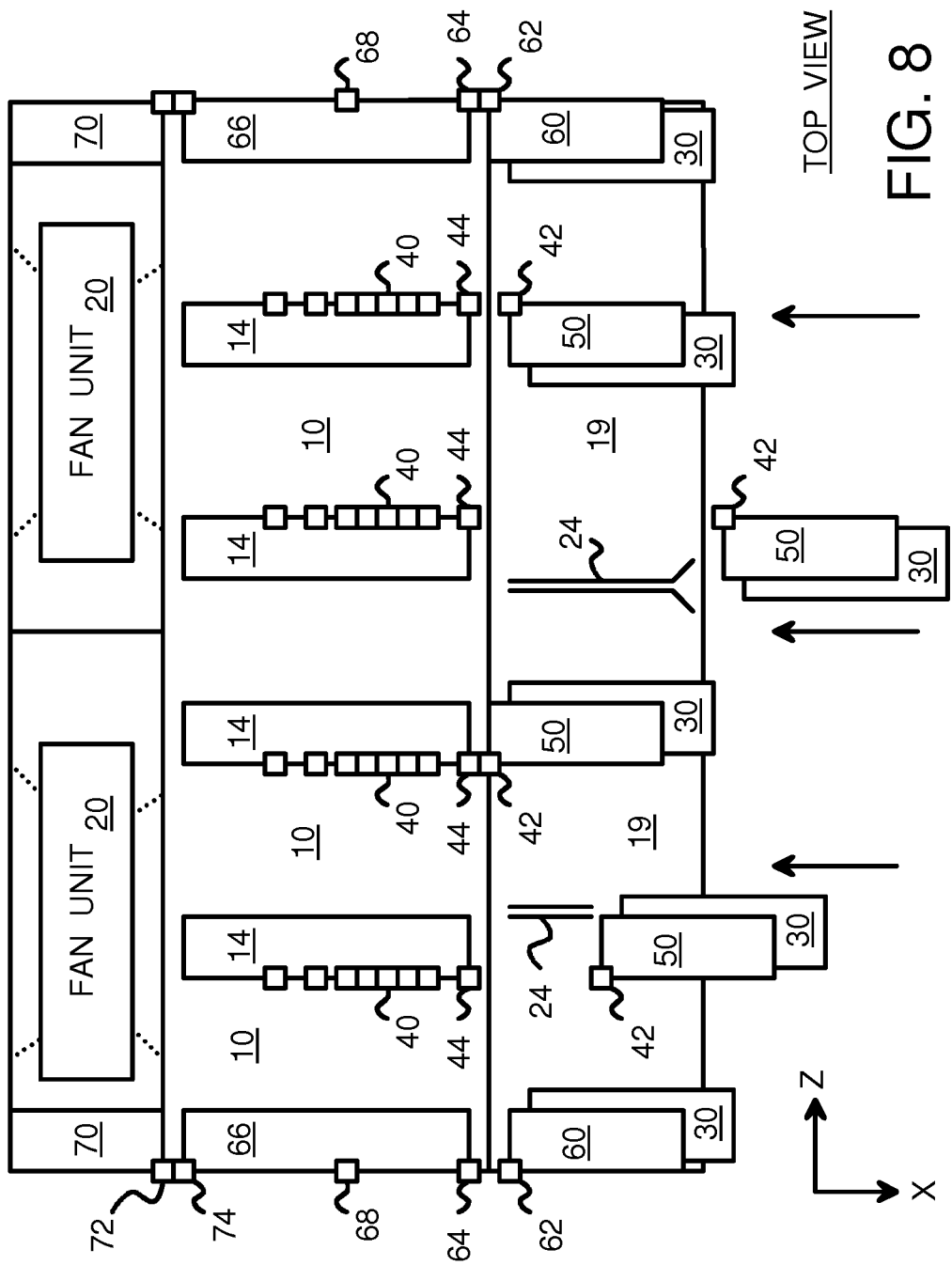
FIG. 8 is a top view of removable boards being inserted into the honeycomb interconnect structure.

FIG. 8 is a top view of removable boards being inserted into the honeycomb interconnect structure. Y-plane board 10 spans and connects to several z-divider boards 14. Z-divider boards 14 and removable boards 50 are shown edge-on. Sled guides 24 on sled carrier floors 19 guide edges of sled 30 to position removable boards 50 relative to z-divider boards 14 so that connectors 42 can mate with connectors 44.

Connectors 40 on z-divider boards 14 connect to y-plane boards 10. Fan banks 20 pull air in the −x direction, past the surfaces of z-divider boards 14 and removable boards 50. Fan controller boards 70 provide power to fans in fan banks 20 and may control fan speed or cycle fans on and off as needed. Power plane 66 provides power to fan controller boards 70 through connectors 74, 72, and also provides power to y-plane board 10 through connector 68. Power supply unit 60 on sled 30 has connector 62 that mates with connector 64 on power plane 66 to provide power generated by power supply unit 60, which may connect to external A.C. power.

Figure 9:
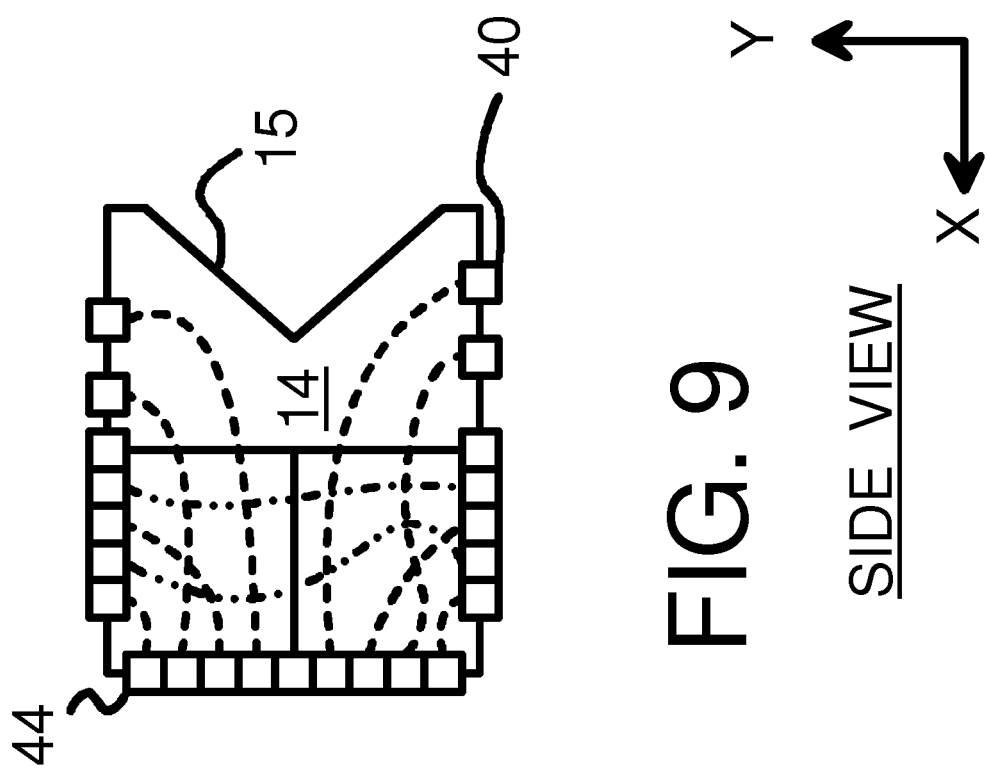
FIG. 9 shows an air flow plenum in the z-divider board.

FIG. 9 shows an air flow plenum in the z-divider board. Notch 15 may be provided on the back of z-divider boards 14, on the rear edge that does not have connectors 40 or connectors 44. Notch 15 faces fan bank 20. Although the primary direction of airflow is in the −x direction, notch 15 allows air to be balanced and distributed more equally in the y direction. Better distribution of airflow is possible. Fans may be located closer to the honeycomb structure when plenums are provided.

Figure 10:
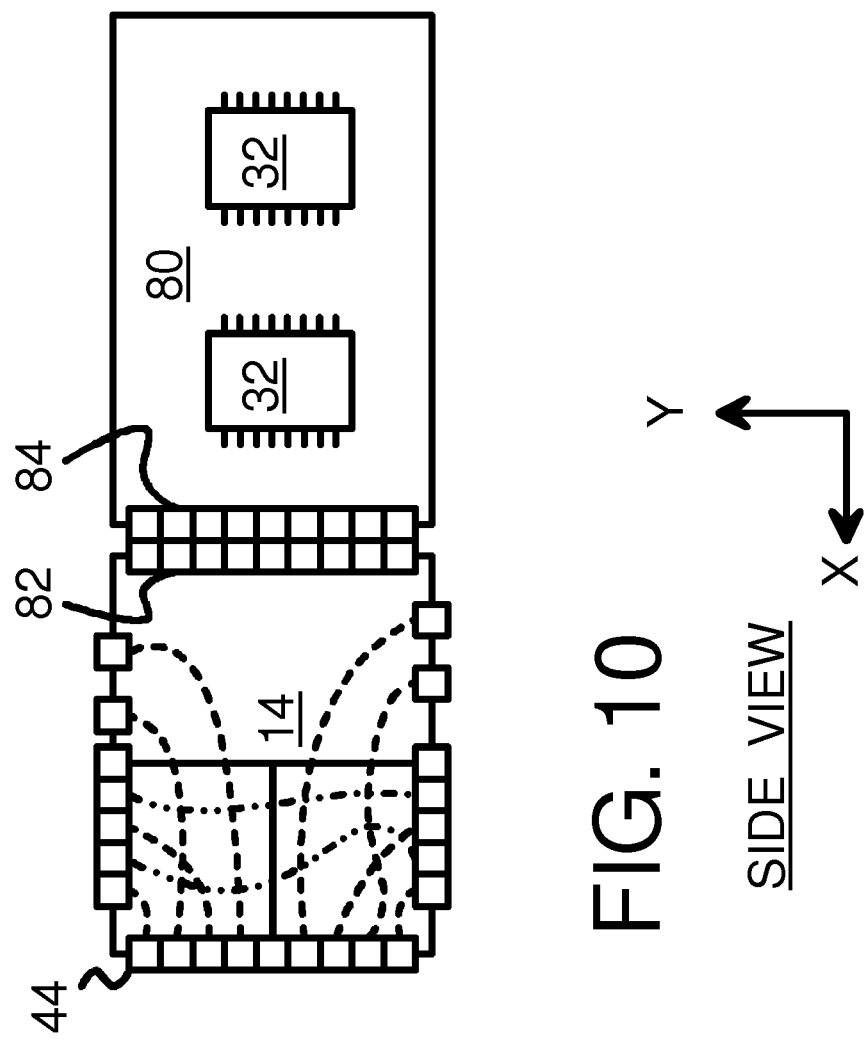
FIG. 10 shows a dual-sided z-divider board.

FIG. 10 shows a dual-sided z-divider board. Additional connectors 82 are placed along the rear edge of z-divider boards 14, away from connectors 44. Rear board 80 has connectors 84 that mate with connectors 82, allowing z-divider board 14 to connect to rear board 80 as well as removable board 50 through connectors 44. Thus two boards with IC's 32 may connect to each z-divider board 14 in this alternate embodiment.

Figure 11:
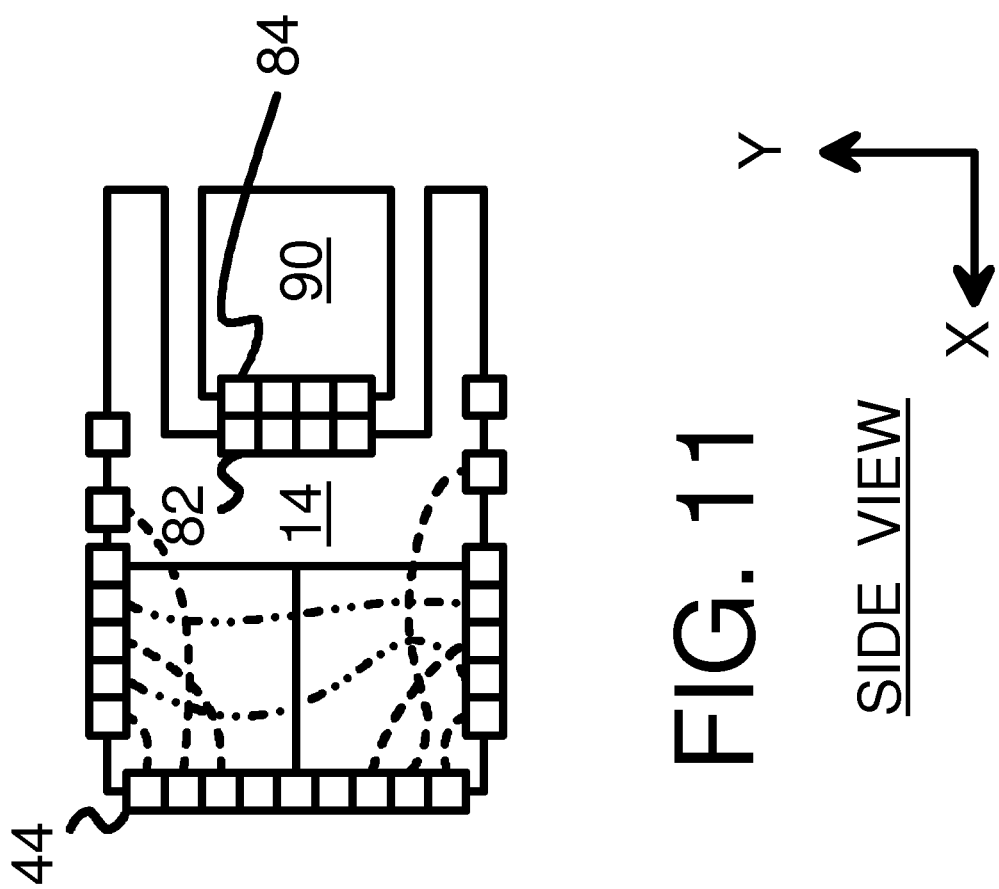
FIG. 11 shows a small board connected to the rear of a z-divider board.

FIG. 11 shows a small board connected to the rear of a z-divider board. Card 90 is a small board with connectors 84 that mate with connectors 82 on z-divider board 14. Card 90 fits within an opening in the rear of z-divider board 14. Card 90 may provide active circuitry such as diagnostic or monitoring circuitry.

Several other embodiments are contemplated by the inventor. For example the honeycomb structure may be expanded in any of the three dimensions. The density may be increased by tighter spacing of boards, or reduced by increased spacing. Empty areas may be added, or honeycomb cells without a sled connected may be used for various purposes, such as for additional airflow, cabling or access for diagnostics, etc. While FIGS. 1A-E have shown a particular method to build the honeycomb structure, other methods or sequences of steps could be substituted. Rather than have y-plane board 10 and z-plane board 12 that span many honeycomb cells, these boards could span only one cell, and many such boards used, such as for z-divider boards 14. Boards may be standard printed-circuit boards (PCB's) made from fiberglass and metal layers, or could have other substrates, such as ceramic, glass, sapphire, rigid or flexible plastics, etc. Various components may be mounted to the boards, or may be formed integrally with the boars, such as capacitors and resistors. Flat cables (ribbon cables) could be used in place of PCBs in the Y-plane direction. In addition to card 90, connectors 84 could be used to mate with cables or could be replaced with optical transceivers.

While sled guides have been described as grooves that accept an edge of a sled, many other kinds of guiding mechanisms could be substituted, such as springs, clips, ridges, depressions, etc. Locking or securing mechanisms and eject mechanisms may also be added as part of the connectors or as part of the boards and sleds. Sleds 30 could be guided by rack guides that are mounted to sides such as sled carrier dividers 16 rather than to the bottom and top, sled carrier floors 19. Both side and top/bottom guides could be employed. Sled 30 or removable boards 50 could overlap with z-divider boards 14. Rather than connect to the front edge of z-divider boards 14, removable board 50 could connect with a connector mounted farther back on z-divider board 14.

The entire honeycomb structure, fans, and carrier guides could be mounted on racks inside an electrical cabinet or other fixture. Indicators such as lights or displays could be added to indicate functioning and non-functioning removable boards 50 or z-divider boards 14 or other components.

While one removable board 50 per sled 30 has been described, there may be a stack of removable boards 50 that fit on one sled. Just one of the removable boards 50 per sled could have a connector that mates with the edge of z-divider boards 14, with the other boards piggy-backed or otherwise connected to the removable board 50 that makes the connection, or two or more boards could have connectors to a stack of connectors on z-divider board 14. Tiled PCB's may be used to span longer distances than the size of a single Y-plane. Z-Plane or other boards may be mirrored and flipped, or may be split or combined. Connections may jump over, pass through, or skip one or more boards. Striping may be used.

Connectors may be asymmetric and keyed or offset to prevent improper or reversed insertion. Boards may be arrayed and mirrored in orientation rather than have the same orientation as shown. Sleds 30 and removable boards 50 may be much longer than shown to allow for more circuitry. Various width, height, and length ratios may be substituted for the boards, sleds, fans, and other components.

The x, y, z coordinate system used is an example for reference. Other assignments of x, y, z could be substituted, and other coordinate systems could be used, such as polar coordinates. The use of the x, y, z coordinate system is to aid understanding of the invention and is not meant to limit the invention. For example, the direction of airflow could be designated as the −z direction. Then z-plane board 12 and z-divider boards 14 are in the x plane or y plane. While airflow in the −x direction has been shown, air could be pushed from behind into the honeycomb structure rather than pulled through, resulting in a +x airflow direction. Additional fans or vents could be added for a more complex airflow.

Notches could be added to the y-plane boards rather than to the z-divider boards. Notches may have various shapes. Rather than use a notch, a hole, or multiple holes could be used as plenums. The size and shape of various boards could be uniform or could vary, such as for other purposes, such as power or fan control. The honeycomb cells could be square or rectangular when 90-degree connectors are used, but could have other shapes such as hexagons if connectors with lower angles are used. A hexagonal cell could have six walls rather than four walls and use 60-degree connectors. Flexible boards could be used rather than rigid boards. By bending the flexible board, various angles could be achieved. A degenerated hexagonal honeycomb structure is one possibility. The boards could have both flexible and rigid parts. Flexible parts could overlap with adjacent boards and use either contact couplers or non-contact couplers. While contact-based couplers have been described, some or all of the couplers could be non-contact, such as capacitive couplers or inductive couplers.

The background of the invention section may contain background information about the problem or environment of the invention rather than describe prior art by others. Thus inclusion of material in the background section is not an admission of prior art by the Applicant.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. An electronic interconnecting chassis comprising:
   a plurality of y-plane boards, each of said y-plane boards having a normal substantially parallel to a y-axis;
   a plurality of z-plane boards, each of said z-plane boards having a normal substantially parallel to a z-axis;
   y-z connectors that connect z-plane boards to y-plane boards, the y-z connectors making electrical connection between the y-plane boards and the z-plane boards;
   a plurality of z-divider boards for the plurality of z-plane boards, each z-divider board having one or more connectors for connecting to one or more adjacent y-plane boards of the plurality of y-plane boards and having a middle connector on the z-divider board near a middle edge between opposing edges of the z-divider board, and wherein each z-divider board has wiring traces that electrically connect the middle connector to the y-z connectors connecting the z-divider board to one or more y-plane boards;
   a plurality of removable boards, each removable board having one or more integrated circuits mounted thereon and wiring traces formed therein that connect the one or more integrated circuits to a mating connector, and each removable board being substantially parallel to the z-divider boards;
   a carrier structure for supporting the plurality of removable boards and for guiding each removable board into position near a middle connector of a z-divider board so that the mating connector on the removable board makes electrical connection with the middle connector on the z-divider board; and
   a fan bank having fans for blowing air in a direction that is substantially parallel to the plurality of z-divider boards and the plurality of removable boards, wherein the air passes in a substantially parallel path along surfaces of the removable boards and surfaces of the z-divider boards, and wherein the air is not substantially blocked by the removable boards, the z-divider boards, and the y-plane boards.

2. The electronic interconnecting chassis of claim 1 wherein the plurality of y-plane boards and the plurality of z-plane boards intersect to form a honeycomb interconnect structure having at least 4 honeycomb cells, each honeycomb cell having two walls formed by y-plane boards and two walls formed by z-plane boards.

3. The electronic interconnecting chassis of claim 2 wherein the carrier structure comprises a plurality of guides for guiding the plurality of removable boards into position for connection to the z-divider boards, wherein the guides are substantially parallel to a direction of airflow, whereby removable boards are inserted in a direction parallel to airflow.

4. The electronic interconnecting chassis of claim 3 further comprising:
   a plurality of sleds, each sled for supporting a removable board of the plurality of removable boards, each sled having a matching guide that slides along a guide of the plurality of guides when the sled is inserted into the carrier structure.

5. The electronic interconnecting chassis of claim 4 wherein the carrier structure further comprises:
   sled carrier floors that are parallel to the y-plane boards; and
   sled carrier dividers that are parallel to the z-divider boards, wherein the sled carrier floors and the sled carrier dividers intersect at right angles to form a carrier honeycomb structure.

6. The electronic interconnecting chassis of claim 5 wherein the plurality of guides are formed on the sled carrier floors.

7. The electronic interconnecting chassis of claim 5 wherein the sled carrier floors are co-planar with the y-plane boards;
   wherein the sled carrier dividers are parallel to and offset from the z-divider boards, wherein the sled carrier dividers are not co-planar with and are offset from planes of the z-divider boards; and
   wherein the middle connectors on the z-divider boards are exposed by the sled carrier dividers being offset from the z-divider boards.

8. The electronic interconnecting chassis of claim 5 wherein the carrier structure is situated in front of the honeycomb interconnect structure, and wherein the fan bank is situated behind the honeycomb interconnect structure.

9. The electronic interconnecting chassis of claim 8 further comprising:
   a power-supply unit, mounted on a last sled that mates with a final z-plane board at an edge of the honeycomb interconnect structure, the power-supply unit providing a power connection and a ground connection to the plurality of removable boards through the z-divider boards, the y-plane boards, and the final z-plane board.

10. The electronic interconnecting chassis of claim 9 further comprising:
    a fan controller board, connected to the final z-plane board, for powering the fan bank, whereby the final z-plane board also powers the fan bank.

11. The electronic interconnecting chassis of claim 8 further comprising:
    an air flow plenum
    comprising at least one of an opening, hole, or notch for equalizing air flow among honeycomb cells in the honeycomb interconnect structure.

12. The electronic interconnecting chassis of claim 8 further comprising:

a plurality of rear connectors, each rear connector formed on a back edge of a corresponding z-divider board, the back edge between the opposing edges and opposite the middle connector of the corresponding z-divider board, the back edge being an edge closest to the fan bank; and a rear board connected to the plurality of rear connectors, the rear board having wiring traces connected to a mated connector on the rear board that is mated with a corresponding rear connector.

13. A honeycomb interconnect structure comprising:

a plurality of interconnect boards, each interconnect board having a major surface, edges, wiring traces, a fabric connector for connecting to other interconnect boards of the plurality of interconnect boards, and a target connector, wherein the wiring traces connect the target connector to the fabric connector;

a plurality of removable boards, each removable board having a major surface, edges, wiring traces, one or more integrated circuits, and a local connector for connecting to the target connector of an interconnect board of the plurality of interconnect boards, wherein the wiring traces of the removable board connect the local connector to the one or more integrated circuits;

a plurality of cells formed by the plurality of interconnect boards, each cell having a central axis, and wherein the plurality of cells comprises at least 4 cells;

a plurality of carrier guides for guiding the plurality of removable boards into position so that the local connector of each removable board mates with the target connector of a corresponding interconnect board;

a carrier structure for supporting the carrier guides, the carrier structure having a plurality of carrier cells that are offset aligned with the plurality of cells, wherein each carrier cell has at least one wall that is offset to expose the target connector on the interconnect board, whereby the carrier cells are aligned with the cells and offset from the target connector; and a bank of fans that generate airflow along the central axes of the plurality of cells for cooling the plurality of interconnect boards and for cooling the plurality of removable boards, wherein airflow is parallel to the major surfaces of the plurality of interconnect boards, and wherein edges of the plurality of interconnect boards face the airflow.

14. The honeycomb interconnect structure of claim 13 further comprising:

a plurality of sleds, each sled being mounted to a corresponding removable board of the plurality of removable boards; and a sled guide formed on each sled, the sled guide for sliding along a carrier guide of the plurality of carrier guides when the local connector on the corresponding removable board is inserted into the target connector.

15. The honeycomb interconnect structure of claim 14 wherein the carrier guide and the sled guide are substantially parallel to the central axis, and whereby the removable boards are inserted parallel to the central axis.

16. The honeycomb interconnect structure of claim 13 wherein each cell has four walls formed from four interconnect boards that are connected at right angles and wherein the cells are rectangular.

17. The honeycomb interconnect structure of claim 13 wherein each cell has six walls formed from six interconnect boards that are connected at 60-degree angles and wherein the cells are hexagonal.

18. The honeycomb interconnect structure of claim 13 wherein the interconnect boards have a flexible portion that is bent to form a bent wall of a cell, and whereby the cells have bent walls formed by the flexible portions of the interconnect boards.

* * * * *